(12) United States Patent
Garzarolli et al.

(10) Patent No.: US 7,425,852 B2
(45) Date of Patent: Sep. 16, 2008

(54) PHASE-LOCKED LOOP

(75) Inventors: Matthias Garzarolli, Erlangen (DE); Martin Lang, Weisendorf (DE)

(73) Assignee: Biotronik CRM Patent AG (CH)

( * ) Notice: Subject to any disclaimer, the term of this patent is extended or adjusted under 35 U.S.C. 154(b) by 44 days.

(21) Appl. No.: 11/563,267

(22) Filed: Nov. 27, 2006

(65) Prior Publication Data
US 2007/0153953 A1 Jul. 5, 2007

(30) Foreign Application Priority Data
Jan. 4, 2006 (DE) ........................ 10 2006 000 735
Mar. 2, 2006 (DE) ........................ 10 2006 009 644

(51) Int. Cl.
*H03L 7/06* (2006.01)
*H03L 7/00* (2006.01)

(52) U.S. Cl. ......................... 327/156; 327/147; 331/15; 331/17

(58) Field of Classification Search ................. 327/147, 327/156; 331/15, 16, 17
See application file for complete search history.

(56) References Cited

U.S. PATENT DOCUMENTS

| 4,105,948 | A | | 8/1978 | Wolkstein |
| 4,896,122 | A | | 1/1990 | Tahernia et al. |
| 5,473,640 | A | | 12/1995 | Bortolini et al. |
| 5,572,167 | A | | 11/1996 | Alder et al. |
| 6,121,849 | A | | 9/2000 | McCollough et al. |
| 6,549,079 | B1 | * | 4/2003 | Crook .......................... 331/17 |
| 7,148,753 | B1 | * | 12/2006 | Garlepp et al. ................. 331/2 |
| 2004/0164810 | A1 | | 8/2004 | Baek |
| 2005/0219004 | A1 | | 10/2005 | Pan |

FOREIGN PATENT DOCUMENTS

EP 0 652 642 A1 5/1995
EP 0 664 616 A 7/1995

OTHER PUBLICATIONS

Search Report issued by the European Patent Office on Mar. 28, 2007, for EP patent application serial No. 06025266.5.

* cited by examiner

*Primary Examiner*—Marvin Lateef
*Assistant Examiner*—Adam Houston
(74) *Attorney, Agent, or Firm*—Craig A. Fieschko, Esq.; DeWitt Ross & Stevens S.C.

(57) ABSTRACT

The present invention relates to a phase-locked loop for frequency synthesis, which has a memory for a control value for the controllable oscillator of the phase-locked loop, which is connectable via a first switch to the control input of the controllable oscillator and is implemented to output a stored control value, and whose frequency divider is connectable at its output via a second switch to the reference oscillator.

14 Claims, 3 Drawing Sheets

PHASE-LOCKED LOOP

Figure 1:
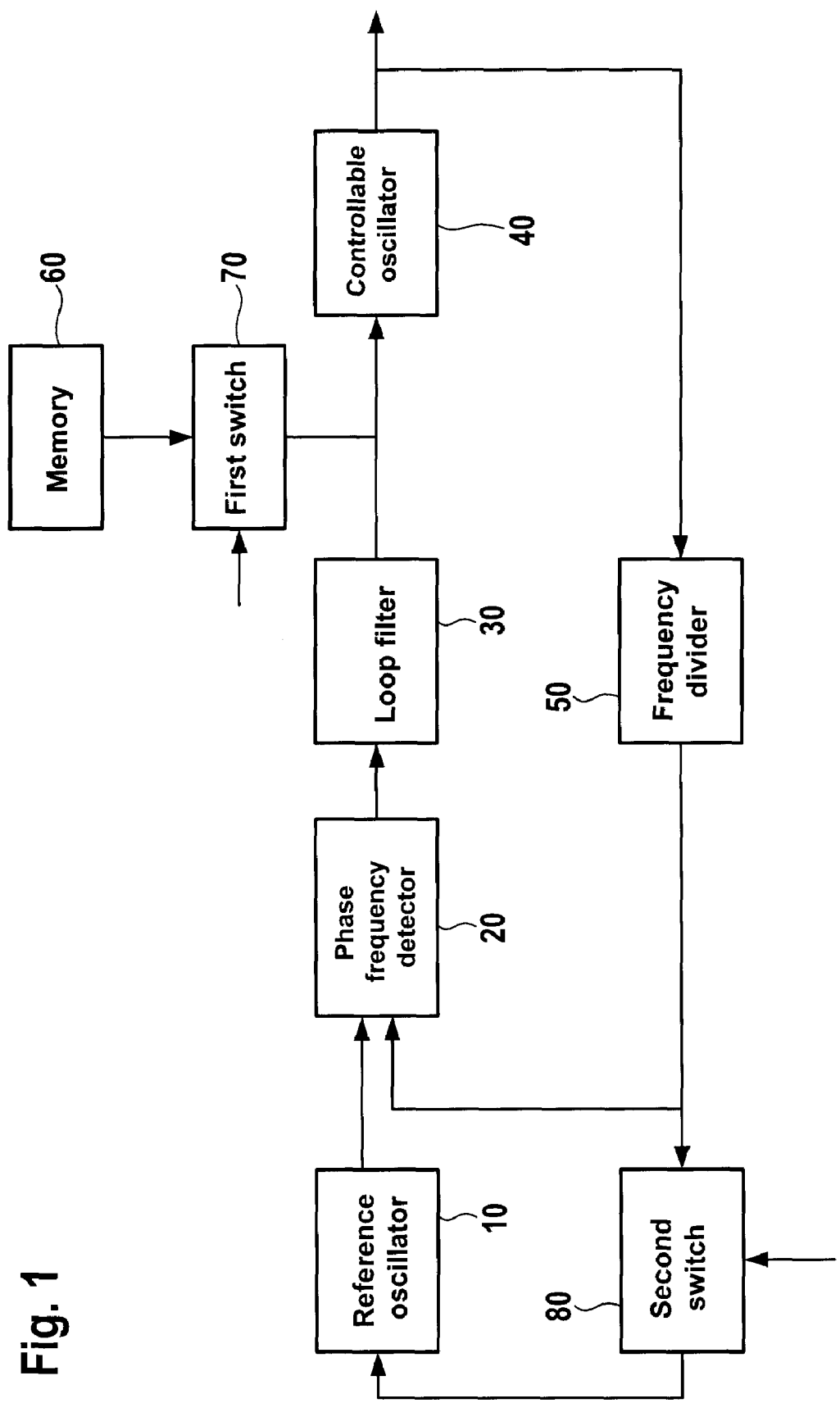

The present invention relates to a phase-locked loop (PLL) for frequency synthesis having improved starting behavior. A phase-locked loop for frequency synthesis has a phase or phase frequency detector, a controllable oscillator, a loop filter, and a frequency divider. To provide a reference clock signal for the frequency synthesis, the phase-locked loop has a reference oscillator or is connected thereto. The reference oscillator or the reference oscillator and a reference clock divider connected after it generate a reference clock signal and output this to a reference input of the phase or phase frequency detector. The controllable oscillator is provided to generate and output a clock signal having an adjustable synthesis frequency. The synthesis frequency is adjustable by a control signal to be applied to the control input of the controllable oscillator. The control signal is adjusted in operation by the regulating mechanism of the phase-locked loop in such a way that the controllable oscillator generates a clock signal having precisely the desired synthesis frequency.

The frequency divider is connected to the controllable oscillator and implemented to divide the clock signal output by the controllable oscillator by a divider value and thus generate a divider clock signal having a lower frequency than the synthesis frequency. This lower frequency of the divider clock signal corresponds to the synthesis frequency divided by the divider value. The divider clock signal is fed back to a feedback input of the phase or phase frequency detector, which compares the reference clock signal and the divider clock signal to one another and outputs a comparison signal to the loop filter, which contains information about the phase relation and/or the frequency relation of reference and divider clock signals.

The loop filter generates a control signal for the controllable oscillator by filtering the comparison signal output by the phase or phase frequency detector.

Phase-locked loops are a well-known means in the prior art for generating electrical signals of a desired synthesis frequency. The generated clock signal is continuously compared to a reference clock signal of a fixed reference frequency, the reference clock signal typically being generated by a quartz oscillator and being of special precision. The synthesized clock signal is coupled to the reference clock signal by the regulating effect of the phase-locked loop, so that in the engaged state of the phase-locked loop, a fixed relation between the frequencies of the synthesized clock signal and the reference clock signal exists. This fixed relation is predefined by the frequency divider located in the feedback path of the phase-locked loop. A frequency divider is typically a digital counter which is clocked by the synthesized clock signal and counts cyclically up to a predefined or adjustable divider value. Upon reaching the divider value or half of the divider value, the frequency divider inverts the logical level at its output, through which it generates a divider clock signal having a frequency divided down by the divider value in relation to the synthesis frequency.

Since the regulating effect of the phase-locked loop ensures that the frequencies of the divider clock signal and the reference clock signal are at least approximately equal, the controllable oscillator of the phase-locked loop is adjusted in operation so that the synthesis frequency of the synthesized clock signal is higher than the frequency of the reference clock signal by the divider value of the frequency divider. By predefining various divider values, clock signals of various synthesis frequencies may thus be generated at uniform frequency of the reference clock signal.

An important area of use of phase-locked loops for frequency synthesis is the synthesis of clock signals for transmitting or receiving radio signals. In some applications, above all for periodic or event-triggered radio transmission of measured values or for monitoring a radio channel for activity of a communication partner, the power consumption per activation of the transceiver circuit including the phase-locked loop is of great influence on the possible operational or service life of the device. This is true in particular for medical implants, which must fulfill therapeutic functions over many years in the body and may only use a small fraction of the battery capacity for communication purposes.

Because of the small amount of data or brief required monitoring time in these applications, the activation time is typically so short that the startup time of the frequency synthesis and the power consumption connected thereto are no longer negligible. Since resonance elements of higher quality, e.g., crystal quartz, must be used in the reference oscillator to achieve high frequency stability and low sideband noise, the startup time of the reference oscillator especially comes into consideration. Without special measures, this is at approximately 1 to 10 ms at the typical frequencies of radio communication, while the phase-locked loop itself requires settling times of only approximately 10 to 100 µs and the actual communication or monitoring time may be in the magnitude of the startup time of the reference oscillator or even less.

Two solutions are known in the prior art for shortening the startup time of the reference oscillator. In the first solution, a strong pulse signal is applied to a terminal of the reference oscillator, which is to bring it out of the equilibrium state. In the second solution, the amplification of the inverting amplifier connected antiparallel to the resonator of the reference oscillator is increased above the amount required for operation in the settled state, to strongly amplify the noise which is always present and bring the reference oscillator out of the equilibrium state through the amplified noise signal.

However, it is problematic that both measures are frequency-unspecific and therefore do not cause an acceleration of the settling of the reference oscillator which may be determined beforehand, because of which the startup time of the reference oscillator is still not precisely predictable.

The present invention is based on the object of providing a phase-locked loop which is improved in relation to the prior art in particular in regard to the startup time of the reference oscillator.

This object is achieved according to the present invention by a phase-locked loop which has a memory for a control value, which is to be connected via a first switch, switchable as a function of a first switching signal, to the control input of the controllable oscillator. Moreover, the phase-locked loop has a second switch, via which the frequency divider is connectable at its output to the reference oscillator as a function of a second switching signal. By closing the first and second switches when the phase-locked loop according to the present invention is put into operation or at another permanently predefined or selectable initialization instant, the memory for the control value is connected to the control input of the controllable oscillator and outputs the stored control value to the controllable oscillator, through which this generates and outputs a clock signal, which already has a frequency near the desired synthesis frequency, after a short settling time typical for controllable oscillators. The frequency divider divides this clock signal down and thus generates a divider clock signal which has a frequency which is in proximity to the resonance frequency of the resonator of the reference oscillator. The divider clock signal reaches the reference oscillator via the closed second switch, which starts up very rapidly because of the excitation by a signal having a frequency near its resonance frequency. After a short settling time span, the first and the second switches may be opened, upon which the phase-locked loop engages at the reference clock signal in accordance with its regulating function and the controllable oscillator is adjusted exactly to the desired synthesis frequency by the reference clock signal now existing.

In order to achieve independence of the resonance frequency of the reference oscillator from the regulating frequency of the phase-locked loop, in one embodiment of the present invention, a reference clock divider connected downstream from the reference oscillator is provided, which is implemented to generate the reference clock signal through division by the reference divider value and output it to the phase or phase frequency detector.

The control value stored in the memory may be permanently predefined or may be determined by a measurement during a prior startup. Such a measurement may not only be performed once, but rather also multiple times, for example periodically or at selectable times. In case of both a permanently predefined stored control value and also a control value determined by a measurement, the phase-locked loop may have a memory for a digital control value and a digital/analog converter, the memory outputting the stored digital control value to the digital/analog converter, which converts the digital control value into an analog control value for the controllable oscillator.

To determine the stored control value by a measurement, the phase-locked loop may additionally have an analog/digital converter, which is connected or connectable at its input to the control input of the controllable oscillator and is connected at its output to the memory. The analog/digital converter is implemented to convert a control value applied to the control input of the controllable oscillator into a digital control value and output it to the memory for storage.

Alternatively, the memory may be implemented as a sample-and-hold element, to sample a control value applied to the control input of the controllable oscillator, store it, and output it to the control input of the controllable oscillator as needed. Since in a sample-and-hold element, the voltage value applied to its input is capacitively stored and is subjected to interfering influences such as noise and tunnel currents during the duration of storage, this embodiment variation of the present invention is especially suitable for systems in which the control value for the controllable oscillator is to be stored over a short time span. The special advantages of this embodiment variation are the especially low circuitry outlay for implementing the memory and the elimination of a quantification error during an analog/digital conversion.

The phase-locked loop according to the present invention may also have more than one memory. To unite the advantages of the memory for a digital control value and of the sample-and-hold element, a further embodiment variation of the phase-locked loop according to the present invention has two memories, of which a first memory is implemented as a memory for a digital control value and a second memory is implemented as a sample-and-hold element.

In order to completely deactivate the regulating mechanism of the phase-locked loop during the startup time of the reference oscillator and thus prevent interference of the accelerated settling of the reference oscillator, in an especially preferred embodiment of the phase-locked loop, the control loop between the phase or phase frequency detector and the controllable oscillator may be disconnected. For this purpose, a third switch switchable as a function of a third switching signal is connected between phase or phase frequency detector and controllable oscillator, which may be opened during the settling of the reference oscillator and may be closed in normal operation of the phase-locked loop.

A preferred embodiment of the phase-locked loop according to the present invention has a control unit for coordinating the procedures in the phase-locked loop during startup, which is implemented to cause the first and the second switches to close by outputting a corresponding first or second switching signal upon an initialization signal.

In an embodiment of the phase-locked loop having a third switch, the control unit may additionally be implemented to output a third switching signal upon the initialization signal, which causes the third switch to open.

The embodiment variations of the phase-locked loop having a control unit may additionally have a reference clock detector, which is connected to the reference oscillator and is implemented to detect the presence of a valid reference clock signal and signal the control unit by a PLL start signal. A valid reference clock signal may exist, for example, if the reference clock signal has a specific minimum signal swing or a specific frequency stability. The reference clock detector may, for example, be formed by a counter whose clock input is connected to the reference oscillator, so that the reference clock detector first begins to count when a reference clock pulse exists. In order to wait for a safety time span until the reference oscillator outputs a frequency-stable reference clock pulse, the reference clock detector may be implemented to first output the PLL start signal upon reaching a predefinable count.

In a continuation of this embodiment variation, the control unit is implemented to output a first and a second switching signal upon receiving the PLL start signal, which cause the first and second switches, respectively, to open. The startup phase of the reference oscillator and/or the phase-locked loop according to the present invention is thus ended and the phase-locked loop begins its operation. If the phase-locked loop has a third switch, the control unit may be implemented to output a third switching signal upon receiving the PLL start signal, which causes the third switch to close.

If the operating parameters of the phase-locked loop are subjected to strong oscillations and therefore the actual synthesis frequency of the signal generated by the controllable oscillator for the same stored control value may vary strongly, in an especially preferred embodiment variation of the phase-locked loop according to the present invention, a memory is provided which is implemented to output a series of different control values, the series comprising at least two control values which are different from one another, so that, depending on the output sequence of the various control values, the controllable oscillator is caused to generate a clock signal having a synthesis frequency which passes over a frequency range while rising, falling, or in alternating directions. In this way, with a suitable selection of the series of the control values, it may be ensured that the frequency of the divider clock signal divided down by the frequency divider is at least sometimes equal to the resonance frequency of the reference oscillator, through which this reference oscillator is caused to resonate and thus to an accelerated startup in each case.

A second aspect of the present invention relates to an electromedical implant, such as a cardiac pacemaker, defibrillator, or cardioverter having a telemetry unit for transmitting data from the implant to an external device, in which the telemetry unit comprises a phase-locked loop according to the first aspect of the present invention for generating a transmitting or receiving clock pulse. The short startup time of the phase-locked loop according to the present invention allows the phase-locked loop to be activated and deactivated in short intervals and thus allows energy, which is only available in strongly limited form in electromedical implants in particular, to be saved.

In the following, the present invention is described in greater detail on the basis of illustrations of exemplary embodiments.

Figure 2:
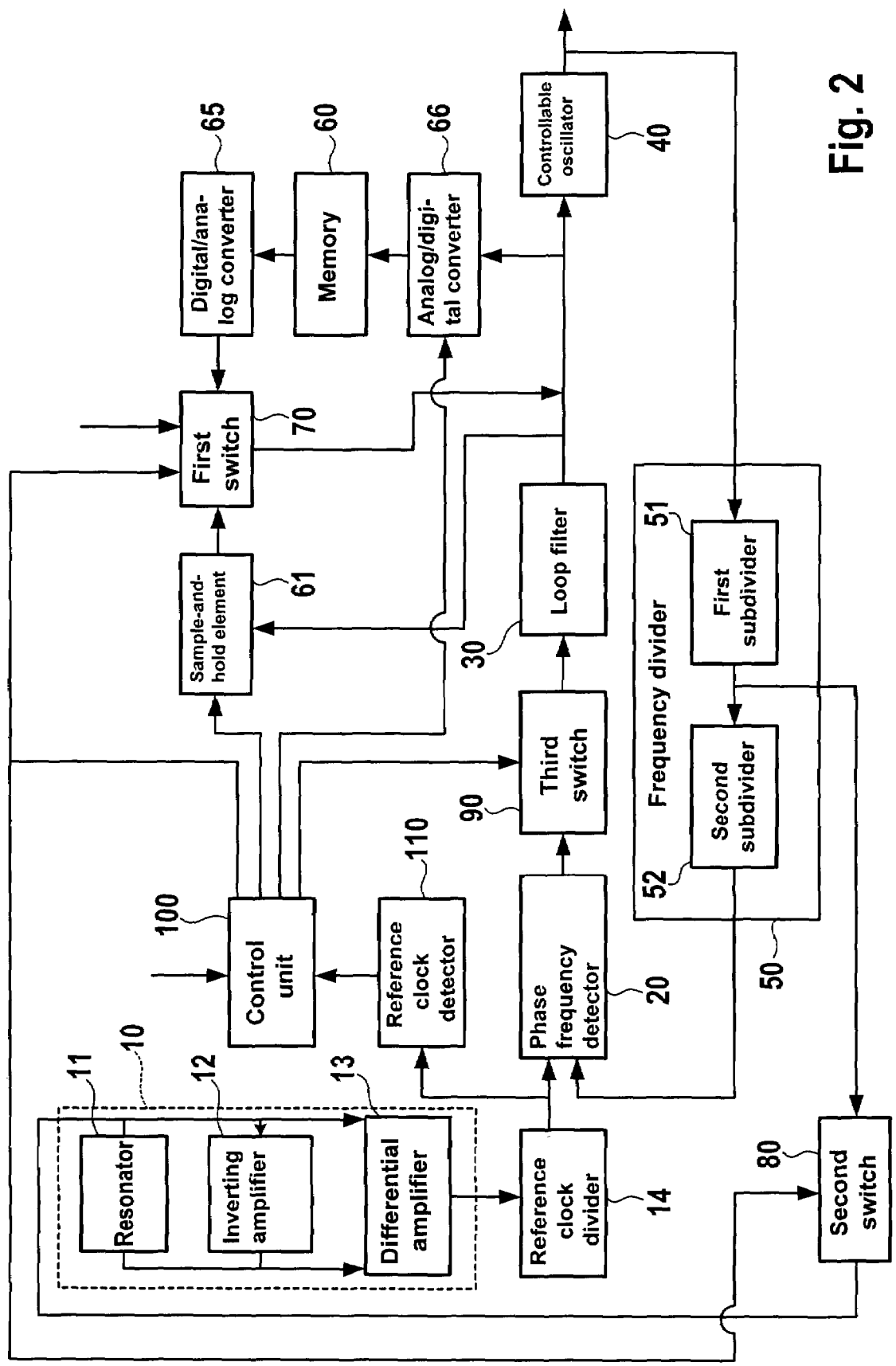
Figure 3:
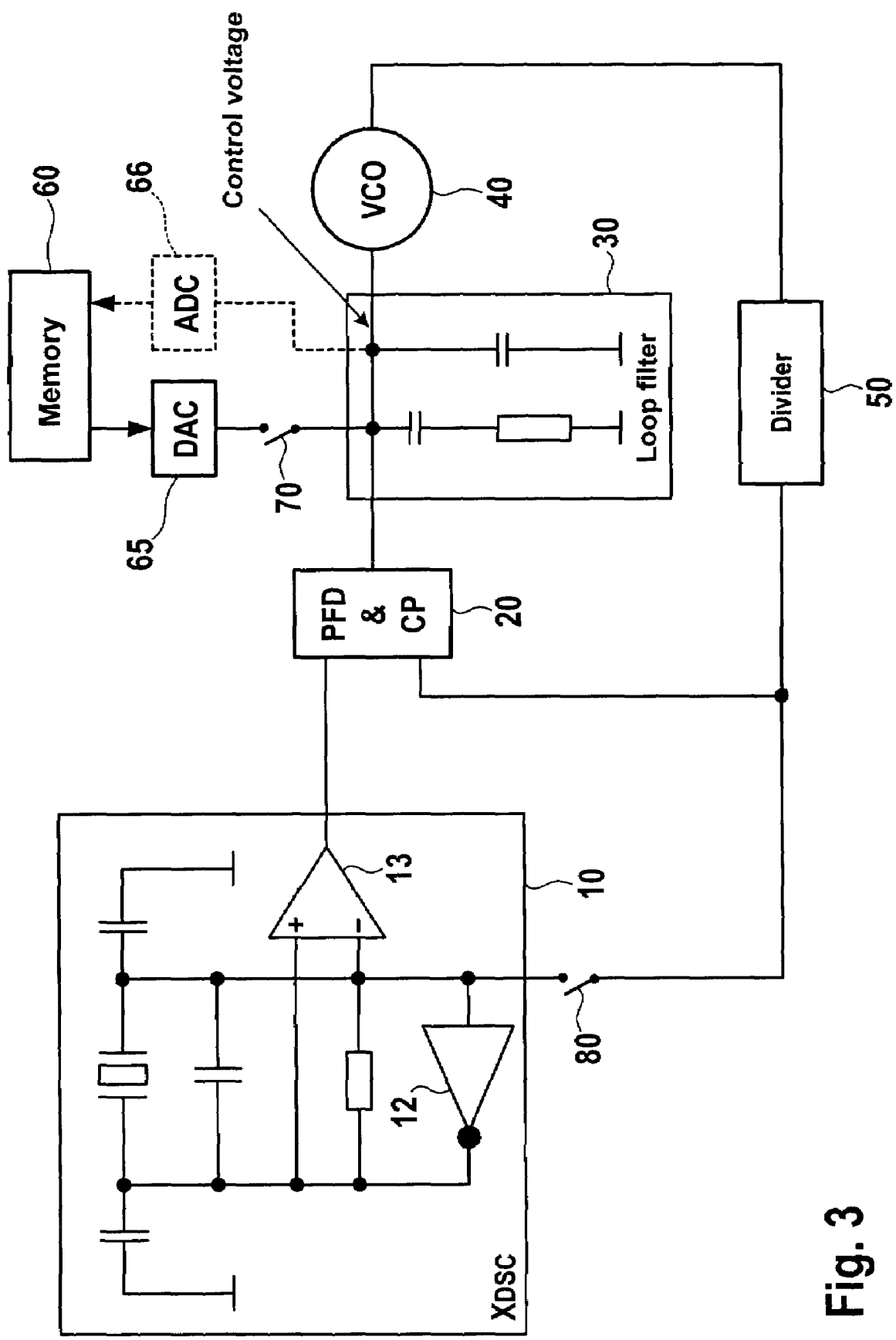

FIG. 1: shows a general illustration of the phase-locked loop according to the present invention in the form of a block diagram;

FIG. 2: shows an embodiment variation of a phase-locked loop according to the present invention having a third switch, two memories, an analog/digital converter, a control unit, and a reference clock detector; and FIG. 3: shows a somewhat more concrete and expanded illustration of the phase-locked loop according to the present invention from FIG. 1.

The phase-locked loop for frequency synthesis shown in FIG. 1 comprises a reference oscillator 10, which is connected at its output to a phase frequency detector 20. A phase detector or, in a special embodiment, a frequency detector may also be used instead of the phase frequency detector 20. The actual control loop of the phase-locked loop comprises, in addition to the phase frequency detector 20, a loop filter 30 connected downstream from the phase frequency detector 20, a controllable oscillator 40, which generates the clock signal to be synthesized by the phase-locked loop, and a frequency divider 50, which divides the clock signal by a divider value and feeds it back to a feedback input of the phase frequency detector 20. According to the present invention, the phase-locked loop is expanded by a first switch 70, a memory 60, and a second switch 80. The memory 60 is implemented to store a control value for the controllable oscillator 40 and output it via the first switch 70, when this is closed, to the controllable input of the controllable oscillator 40. The first switch 70 is provided to connect the memory 60 to the control input of the controllable oscillator or disconnect it therefrom as a function of a first switching signal. The second switch 80 connects the output of the frequency divider 50 to the reference oscillator 10 as a function of a second switching signal.

During startup of the phase-locked loop according to the present invention, the first switch 70 and the second switch 80 are closed, so that the output of the memory 60 is connected to the control input of the controllable oscillator 40 and the output of the frequency divider 50 is connected to the reference oscillator 10. The control values stored in the memory 60 for the controllable oscillator 40 represent a typical control value for the controllable oscillator 40, which causes the controllable oscillator 40 to generate a clock signal of a frequency near the desired synthesis frequency. Since the controllable oscillator 40 starts up more rapidly than the reference oscillator 10, no reference clock signal is available in this phase, so that the regulatory mechanism of the phase-locked loop may not yet activate and modulate the controllable oscillator 40 in such a way that the desired synthesis frequency is already set exactly. The clock signal generated during the startup phase by the controllable oscillator 40 is divided down by the divider value by the frequency divider 50, through which a feedback clock signal results, whose frequency is in proximity to the resonance frequency of the reference oscillator 10. The feedback clock signal reaches the reference oscillator 10 via the second switch 80, which is closed during the startup phase, and excites the reference oscillator to oscillate within a short time because of the close proximity to the resonance frequency of the resonance oscillator 10, through which the startup time of the reference oscillator 10 and thus of the phase-locked loop according to the present invention is significantly shortened.

As soon as the reference oscillator 10 has settled, the phase-locked loop may exercise the regulatory mechanism provided and activate the controllable oscillator 40 in such a way that the frequencies of the feedback clock signal and the reference clock signal at the inputs of the phase frequency detector are equal. When this condition is fulfilled, the frequency of the clock signal generated by the controllable oscillator 40 is equal to the desired synthesis frequency. To activate the regulatory mechanism of the phase-locked loop, the first switch 70 and the second switch 80 must be open, so that the control value at the control input of the controllable oscillator 40 may be modulated by the comparison signal filtered by the loop filter 30 and generated by the phase frequency detector 20, and the reference oscillator 10 is no longer influenced by the frequency divider 50 via the reference clock signal coupled in by the second switch 80.

The preferred embodiment variation of the phase-locked loop shown in FIG. 2 was expanded by several components in relation to the phase-locked loop shown in FIG. 1. In the actual phase-locked loop, a third switch 90 was inserted between the phase frequency detector 20 and the loop filter 30, by which, as a function of a third switching signal, the output of the loop filter 30 may be disconnected from the input of the controllable oscillator 40. The third switch 90 is connected to a control unit 100, which, in addition to the third switching signal for the third switch 90, generates the first switching signal for the first switch 70 and the second switching signal for the second switch 80. In the exemplary embodiment shown, the first switch 70 and the second switch 80 are always switched jointly into the same particular state, so that the first and the second switching signals are identical and the first switch 70 and the second switch 80 are connected to the same output of the control unit 100.

The reference oscillator 10 is shown disassembled into its main components in FIG. 2. These are a resonator 11, an inverting amplifier 12, and a differential amplifier 13. The inverting amplifier 12 is connected antiparallel to the resonator 11 and excites this to oscillations in the settled state, by setting the amplification of the loop made of resonator 11 and inverting amplifier 12 greater than 1 at the resonance frequency of the resonator 11. The two poles of the resonator 11 are connected to the differential inputs of the differential amplifier 13, which amplifies the clock signal generated by the resonator 11 and the inverting amplifier 12 and outputs it single-ended to a reference clock divider 14, which divides it down by a reference clock divider value, i.e., divides down the clock signal output by the differential amplifier 13 by the reference clock divider value. Such a configuration offers the greatest possible freedom in the selection of the clock frequencies of reference oscillator and the cutoff frequency of the regulatory function of the phase-locked loop, this configuration requiring a two-stage frequency divider 50 having a first subdivider 51 and a second subdivider 52, so that both the frequencies of the signals at the two inputs of the phase frequency detector 20 in the engaged state of the phase-locked loop, and also the feedback clock signal branched off from the frequency divider 50 after the first subdivider 51 and the resonance frequency of the resonance oscillator 10 are equal. The divider values of the second subdivider 52 and of the reference clock divider 14 are typically to be selected as equal in such a configuration, the total divider value of the frequency divider 50 results from the product of the divider values of the first and second subdividers 51, 52.

The reference clock divider 14 is connected at its output to the reference input of the phase frequency detector 20, to which it outputs the divided-down reference clock signal. The output of the differential amplifier 13 is additionally connected to a reference clock detector 110, which has the task of detecting the presence of a valid reference clock pulse and signaling the control unit 100 connected to the reference clock detector 110, so that this control unit may cause the first switch 70 and the second switch 80 to open and the third switch 90 to close, by which the startup phase of the phase-locked loop according to the present invention is terminated and the regulatory mechanism of the phase-locked loop may begin to act. The control unit 100 additionally has an input for an initialization signal, upon whose receipt the control unit 100 initiates the startup phase by outputting corresponding first, second, and third switching signals to the first, second, and third switches (70, 80, 90), respectively.

During the startup phase, the loop filter 30 and thus the control input of the controllable oscillator 40 are disconnected from the output of the phase frequency detector 20 because of the open third switch 90, so that an invalid control value is not generated for the controllable oscillator 40 in the absence of a reference clock signal. In order to nonetheless apply a valid control value for the controllable oscillator 40 to its control input, the output of either a sample-and-hold element 61 or a digital/analog converter 65, which is connected to a memory 60, is connected via the first switch 70 to the control input of the controllable oscillator 40. Which of the two components is to be connected by the first switch 70 to the control input of the controllable oscillator 40 may be predefined by a further switching signal for the first switch 70. The sample-and-hold element 61 is connected at its input to the control input of the controllable oscillator 40 and implemented to capacitively store a control value applied there at a selectable instant. The memory 60 is implemented to store a control value converted into a digital representation and output it to the digital/analog converter 65 for the conversion into an analog control value for the controllable oscillator 40. The memory 60 is implemented as writable by an analog/digital converter 66 in the exemplary embodiment shown, in order to ensure that the control value, which is stored by the memory 60 and is a function of numerous operating parameters, contains a control value suitable for the particular phase-locked loop and tailored to the existing operating conditions. The analog/digital converter 66 may convert the control value applied to the controllable oscillator 40 into a digital representation and output it to the memory 60 for this purpose at a selectable instant. It is also conceivable to digitize the particular applied control value multiple times periodically or after a predefinable sequence and to cause the memory 60 to store the particular last value or a value derived from multiple measurements.

The sample-and-hold element 61 and the analog/digital converter 66 are connected via signal lines to the control unit 100, which may predefine the instant of a particular measurement of the control value at the control input of the controllable oscillator 40 by outputting corresponding signals to the sample-and-hold element 61 and/or to the analog/digital converter 66.

Both the sample-and-hold element 61 and also the analog/digital converter 66 may be turned on and off by a further switch in each case to reduce the capacitive load at the control input of the controllable oscillator 40 or to determine the instant of the measurement of the control signal.

FIG. 3 shows a somewhat more concrete and expanded illustration of the phase-locked loop according to the present invention shown in FIG. 1. The reference oscillator 10 is implemented as a quartz oscillator, which may be implemented according to the circuit shown in the figure having an oscillating quartz, three capacitances (e.g., capacitors), a resistor, an inverting amplifier 12, and a differential amplifier 13. The controllable oscillator 40 of the embodiment variation shown is implemented as a voltage-controlled oscillator (VCO), so that the control signal and the control values for the controllable oscillator 40 stored by the memory are electrical voltages or represent them. The loop filter 30 of the phase-locked loop according to the present invention may be implemented as a circuit made of two capacitors and a resistor having a pole and a zero point, as shown in the figure. The phase-locked loop according to the present invention may optionally be expanded by an analog/digital converter 66, which is shown by dashed lines in FIG. 3.

What is claimed is:

1. A phase-locked loop for frequency synthesis having a phase or phase frequency detector, a controllable oscillator, a loop filter, and a frequency divider,
   a. the phase-locked loop comprising a reference oscillator or being connectable to a reference oscillator, the reference oscillator being implemented to generate a reference clock signal and output it to a reference input of the phase or phase frequency detector,
   b. the controllable oscillator:
      (1) having a control input for a control signal and being implemented to generate a clock signal,
      (2) having a synthesis frequency adjustable by the control signal applied to the control input in operation, and output it to the frequency divider,
   c. the frequency divider being implemented:
      (1) to divide the clock signal output by the controllable oscillator by a divider value and thus generate a divider clock signal which has a frequency reduced by the divider value in relation to the synthesis frequency, and
      (2) to output the divider clock signal to a feedback input of the phase or phase frequency detector,
   d. the phase or phase frequency detector being implemented:
      (1) to compare the reference clock signal and the divider clock signal to one another and
      (2) to generate a comparison signal which contains information about the phase relation or the frequency relation or about the phase relation and the frequency relation of reference and divider clock signals, and
      (3) to output the comparison signal to the loop filter,
   e. the loop filter being implemented to generate a control signal, by filtering the comparison signal output by the phase or phase frequency detector, and output it to the controllable oscillator,
   characterized in that:
   A. the phase-locked loop has a memory for a control value, which is connectable to the control input of the controllable oscillator via a first switch, which is switchable as a function of a first switching signal, and is implemented to output a stored control value, and
   B. the frequency divider is connectable at its output via a second switch, which is switchable as a function of a second switching signal, to the reference oscillator.

2. The phase-locked loop according to claim 1, wherein a reference clock divider is connected downstream from the reference oscillator, which is implemented to generate the reference clock signal by dividing by the reference divider value and output it to the phase or phase frequency detector.

3. The phase-locked loop according to one of claims 1 or 2, characterized in that the memory is implemented to store and output a digital control value, and the phase-locked loop has a digital/analog converter, which is connected at its input to the memory and at its output to the control input of the controllable oscillator and is implemented to convert a digital control value output by the memory into an analog control value for the controllable oscillator.

4. The phase-locked loop according to claim 3, characterized in that the phase-locked loop has an analog/digital converter, which is connected or connectable at its input to the control input of the controllable oscillator input and is connected at its output to the memory and is implemented to convert a control value applied to the control input of the controllable oscillator into a digital control value and output it to the memory.

5. The phase-locked loop according to one of claims 1 or 2, characterized in that the memory is implemented as a sample-and-hold element, to sample a control value applied to the control input of the controllable oscillator, store it, and output it to the control input of the controllable oscillator.

6. The phase-locked loop, according to claim 3, 4, or 5 characterized in that the phase-locked loop has two memories, of which a first memory is implemented as a memory for a digital control value and a second memory is implemented as a sample-and-hold element.

7. The phase-locked loop according to one of the preceding claims, characterized by a third switch, switchable as a function of a third switching signal, which is connected between phase or phase frequency detector and controllable oscillator in such a way that the control input of the controllable oscillator is disconnectable from the output of the phase or phase frequency detector.

8. The phase-locked loop according to one of the preceding claims, characterized by a control unit, which is implemented to output a first and a second switching signal, which cause the first and second switches, respectively, to close, upon an initialization signal.

9. The phase-locked loop according to claim 7 or 8, characterized in that the control unit is implemented to output a third switching signal, which causes the third switch to open, upon the initialization signal.

10. The phase-locked loop according to claim 8, characterized by a reference clock detector, which is connected to the reference oscillator and is implemented to detect the presence of a valid reference clock signal and to signal the control unit by a PLL start signal.

11. The phase-locked loop according to claim 10, characterized in that the control unit is implemented to output a first and a second switching signal, which cause the first and second switches, respectively, to open, upon receiving the PLL start signal.

12. The phase-locked loop according to claim 9 or 11, characterized in that the control unit is implemented to output a third switching signal, which causes the third switch to close, upon receiving the PLL start signal.

13. The phase-locked loop according to one of the preceding claims, characterized in that the memory is implemented to output a series of different control values.

14. An electromechanical implant, particularly a cardiac pacemaker, defibrillator, or cardioverter, having a telemetry unit for transmitting data from the implant to an external device, characterized in that the telemetry unit comprises a phase-locked loop according to one of the preceding claims for generating a transmit or receive clock pulse.

* * * * *